United States Patent
Tang et al.

(10) Patent No.: US 11,876,527 B2
(45) Date of Patent: Jan. 16, 2024

(54) ERROR CALIBRATION APPARATUS AND METHOD

(71) Applicant: Skymizer Taiwan Inc., Taipei (TW)

(72) Inventors: Wen Li Tang, Taipei (TW); Shu-Ming Liu, Taipei (TW); Der-Yu Tsai, Taipei (TW); Po-Sheng Chang, Taipei (TW)

(73) Assignee: Skymizer Taiwan Inc., Taipei (TW)

( * ) Notice: Subject to any disclaimer, the term of this patent is extended or adjusted under 35 U.S.C. 154(b) by 242 days.

(21) Appl. No.: 17/548,575

(22) Filed: Dec. 12, 2021

(65) Prior Publication Data

US 2023/0097158 A1    Mar. 30, 2023

(30) Foreign Application Priority Data

Sep. 27, 2021    (TW) .................. 110135892

(51) Int. Cl.
| | |
|---|---|
| *H03M 1/10* | (2006.01) |
| *G06F 7/523* | (2006.01) |
| *G06F 7/501* | (2006.01) |
| *G06N 3/065* | (2023.01) |

(52) U.S. Cl.
CPC .......... *H03M 1/1014* (2013.01); *G06F 7/501* (2013.01); *G06F 7/523* (2013.01); *G06N 3/065* (2023.01); *H03M 1/1071* (2013.01)

(58) Field of Classification Search
CPC ... H03M 1/1014; H03M 1/1071; G06F 7/501; G06F 7/523; G06N 3/065
USPC ........................................................ 341/120
See application file for complete search history.

(56) References Cited

U.S. PATENT DOCUMENTS

| | | | |
|---|---|---|---|
| 11,101,810 B1* | 8/2021 | Veldhoven | H03M 1/0626 |
| 2006/0176197 A1* | 8/2006 | McNeill | H03M 1/1004 |
| | | | 341/120 |
| 2019/0122102 A1 | 4/2019 | Leobandung | |
| 2020/0272893 A1* | 8/2020 | Danial | H03M 1/1038 |
| 2020/0311534 A1 | 10/2020 | Lesso | |

(Continued)

FOREIGN PATENT DOCUMENTS

| | | |
|---|---|---|
| CN | 111478703 | 7/2020 |
| CN | 111639757 | 9/2020 |

(Continued)

OTHER PUBLICATIONS

"Office Action of Taiwan Counterpart Application", dated Jun. 20, 2022, p. 1-p. 6.

(Continued)

*Primary Examiner* — Jean B Jeanglaude
(74) *Attorney, Agent, or Firm* — JCIPRNET

(57) ABSTRACT

An error calibration apparatus and method are provided. The method is adapted for calibrating a machine learning (ML) accelerator. The ML accelerator achieves computation by using an analog circuit. An error between an output value of one or more computing layers of a neural network and a corresponding corrected value is determined. The computation of the computing layers is achieved by the analog circuit. A calibration node is generated according to the error. The calibration node is located at the next layer of the computing layers. The calibration node is used to minimize the error. The calibration node is achieved by a digital circuit. Accordingly, error and distortion of the analog circuit could be reduced.

10 Claims, 3 Drawing Sheets

(56) References Cited

U.S. PATENT DOCUMENTS

2020/0364548 A1 11/2020 Chang et al.
2020/0380350 A1 12/2020 Lesso

FOREIGN PATENT DOCUMENTS

| CN | 112070204 | 12/2020 |
| CN | 112749784 | 5/2021 |
| TW | 202006734 | 2/2020 |

OTHER PUBLICATIONS

"Office Action of Taiwan Counterpart Application", dated Mar. 29, 2023, p. 1-p. 6.

* cited by examiner

ERROR CALIBRATION APPARATUS AND METHOD

CROSS-REFERENCE TO RELATED APPLICATION

This application claims the priority benefit of Taiwan application serial no. 110135892, filed on Sep. 27, 2021. The entirety of the above-mentioned patent application is hereby incorporated by reference herein and made a part of this specification.

BACKGROUND

Technical Field

The disclosure relates to an error calibration, and more particularly, to an error calibration device and an error calibration method.

Description of Related Art

A neural network is an important topic in artificial intelligence (AI), and decisions thereof are made by simulating the operation of human brain cells. It is worth noting that there are many neurons in human brain cells, and the neurons are connected to one another through synapses. Each of the neurons may receive signals through the synapses, and the output of the signals after transformation is re-transmitted to another neuron. The transformation ability of each of the neurons is different, and human beings can form the abilities to think and judge through the operations of the signal transmission and transformation. The neural network obtains the corresponding ability according to the operations. The neural network is often applied to image recognition. In the operation of each of the neurons, the input component is multiplied by the weight of the corresponding synapse (possibly with an offset), and then output by the computation of the nonlinear function (for example, an activation function), thereby capturing image features.

On the other hand, although there are accelerators on the market that achieve computation related to the neural network through analog circuits, it is inevitable that the analog circuits may have issues such as digital-to-analog conversion (DAC) offset, distortion of the amplifier, and errors in gain, offset, and voltage.

SUMMARY

In view of this, the embodiment of the disclosure provides an error calibration apparatus and an error calibration method, which achieve error detection and calibration digitally.

The error calibration method in the embodiment of the disclosure is adapted for calibrating a machine learning accelerator, and the machine learning accelerator achieves a computation by using an analog circuit. The error calibration method includes (but is not limited to) the following steps. An error between an output value of one or more computing layers of a neural network and a corresponding corrected value is determined. The computation of the computing layers is achieved by the analog circuit. A calibration node is generated according to the error. The calibration node is located at the next layer of the operational layers. The calibration node is used to minimize the error. The calibration node is achieved by a digital circuit.

The error calibration apparatus in the embodiment of the disclosure includes (but is not limited to) a memory and a processor. The memory is used to store a program code. The processor is coupled to the memory. The processor is configured to load and execute the program code to determine the error between the output value of the one or more computing layers of the neural network and the corresponding correct value, and generate the calibration node according to the error. The computation of the computing layers is achieved by the analog circuit, and the machine learning accelerator achieves the computation by using the analog circuit. The calibration node is located at the next layer of the operational layers. The calibration node is used to minimize the error. The calibration node is achieved by the digital circuit.

Based on the above, in the error calibration apparatus and the error calibration method according to the embodiment of the disclosure, the calibration node of the neural network is generated based on the error caused by the computation of the analog circuit to calibrate the error and minimize the error. In this way, the operating efficiency of the system may be improved, and the error rate may be improved.

In order for the aforementioned features and advantages of the disclosure to be more comprehensible, embodiments accompanied with drawings are described in detail below

DETAILED DESCRIPTION OF DISCLOSED EMBODIMENTS

Figure 1:
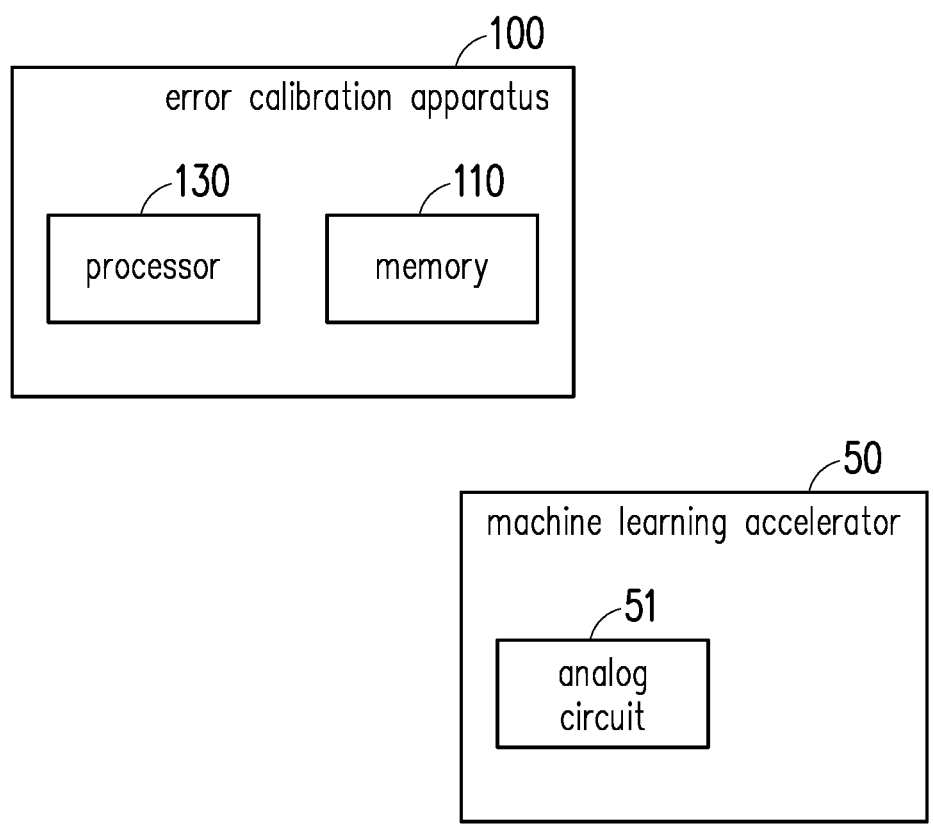
FIG. 1 is an architectural view of a system according to an embodiment of the disclosure.

FIG. 1 is an architectural view of a system according to an embodiment of the disclosure. Referring to FIG. 1, a system 1 includes (but is not limited to) a machine learning accelerator 50 and an error calibration apparatus 100.

The machine learning accelerator 50 may be a computer system, a chip, a display card, an application-specific integrated circuit (ASIC), a nonvolatile memory (for example, a phase change memory (PCM), a resistive RAM (ReRAM), or a magnetoresistive random access memory (MRAM). The machine learning accelerator 50 may achieve, for example, a convolutional neural network (CNN), a recurrent neural network (RNN), a multi-layer perceptron (MLP), a support vector machine (SVM), and/or other algorithms.

In an embodiment, the machine learning accelerator 50 includes an analog circuit 51, and achieves a computation by using the analog circuit 51. The analog circuit 51 may be formed by an amplifier, an analog-to-digital converter (ADC), a digital-to-analog converter (DAC), a memory, a resistor, a capacitor, and/or other electronic elements. For example, an input digital signal is converted into an analog signal with a multi-step voltage level through the DAC, and the analog signal is stored in the memory. When it is necessary to perform a multiply accumulate computation, a voltage value may be converted into a current by using Ohm's law to be output to the ADC. That is, the multiply accumulate computation is achieved. For another example, a cross pressure between a bit line (BL) and a source line (SL) of a ReRAM cell is used as an input value (for example, a feature value), and a weight is stored in a memory cell in a vertical manner. A sum of the currents of the cell may be accumulated in the capacitor, then the voltages on the several capacitors are converted into digital signals, and the digital signals are computed to generate a result of the multiply accumulate computation.

The error calibration apparatus 100 may be a desktop computer, a notebook computer, a smart phone, a tablet computer, a server, or other computing apparatuses.

The error calibration apparatus 100 includes (but is not limited to) a memory 110 and a processor 130.

The memory 110 may be a static or dynamic random access memory (RAM), a read-only memory (ROM), a flash memory, a register, a combinational circuit, or a combination of the above elements.

In an embodiment, the memory 110 is used to store image-related data, the weight used in the multiply accumulate (MAC) computation for capturing the feature of the image, and a value used in an activation computation, a pooling computation, and/or other neural network computations. In other embodiments, a user may determine the type of data stored in the memory 110 according to actual requirements. In an embodiment, the memory 110 is used to store a program code, a software module, a configuration, data, or a file (for example, a parameter, an error, a value, and an electrical characteristic, etc.), which will be described in detail in subsequent embodiments.

The processor 130 is coupled to the memory 110. The processor 130 may be a circuit formed by one or more of multiplexers, adders, multipliers, encoders, decoders, or various types of logic gates, and may be a central processing unit (CPU), a graphic processing unit (GPU), other programmable general-purpose or special-purpose microprocessors, a digital signal processor (DSP), a programmable controller, a field programmable gate array (FPGA), an application-specific integrated circuit (ASIC), a neural network accelerator, other similar elements, or a combination of the above elements. In an embodiment, the processor 130 is configured to perform all or a part of the operations of the error calibration apparatus 100, and may load and execute the software module, the program code, the file, and the data stored in the memory 110. In some embodiments, the operation of the processor 130 may be achieved by software.

Hereinafter, various elements or circuits in the error calibration apparatus 100 will be used to describe a method according to the embodiment of the disclosure. Each of the processes of the method may be adjusted accordingly according to the implementation situation, and the disclosure is not limited thereto.

Figure 2:
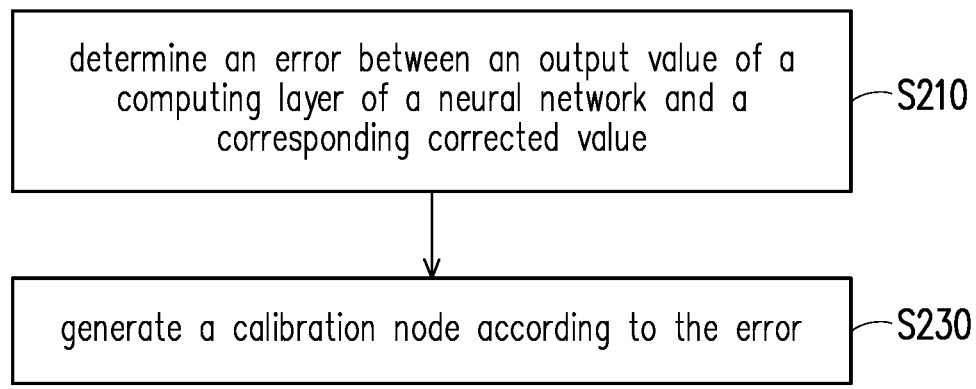
FIG. 2 is a flowchart of an error calibration method according to an embodiment of the disclosure.

FIG. 2 is a flowchart of an error calibration method according to an embodiment of the disclosure. Referring to FIG. 2, the processor 130 determines an error between an output value of one or more computing layers of a neural network and a corresponding corrected value (step S210). Specifically, the neural network may include the one or more computing layers. The computing layer may be a convolutional layer, an activation layer, a pooling layer, or other neural network related layers. A computation of the computing layers is achieved by the analog circuit 51.

Figure 3:
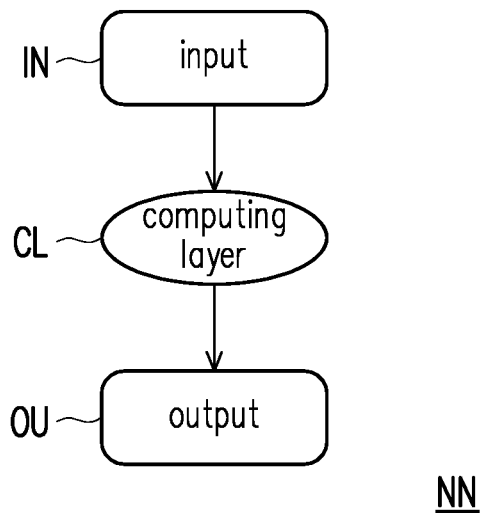
FIG. 3 is a schematic view of a neural network according to an embodiment of the disclosure.

For example, FIG. 3 is a schematic view of a neural network NN according to an embodiment of the disclosure. Referring to FIG. 3, the neural network NN includes a computing layer CL. For example, the computing layer CL is a convolutional layer. An input IN (for example, a tensor) is computed by a convolution computation of the computing layer CL to obtain an output OU (for example, a tensor). The computation of the computing layer is achieved by the analog circuit 51.

In an embodiment, the processor 130 may select the output values from the first computing layer to the $m^{th}$ computing layer, where m is a positive integer. In another embodiment, the processor 130 may select the output values from the $m^{th}$ computing layer to the last computing layer. In still another embodiment, the processor 130 may select the output value of the $m^{th}$ computing layer.

Regarding the acquisition of the output value, in an embodiment, the processor 130 may acquire an electrical characteristic of the analog circuit 51. The electrical characteristic is related to a voltage, current, impedance, gain, offset, time sequence, or other characteristics of any electronic element in the analog circuit 51. The processor 130 may simulate the analog circuit 51 according to the electrical characteristic. In addition, the processor 130 simulates the output value of the computing layer. In other words, the processor 13 estimates the output value obtained by the analog circuit 51 after inputting an input sample into the one or more computing layers according to the electrical characteristic. The input sample may be an image, sound, or various types of sensing values.

In another embodiment, the processor 130 may receive the output value from the machine learning accelerator 50 through an input interface. The input interface may be a communication transceiver (for example, based on Wi-Fi, Ethernet, or Bluetooth), a transmission interface (for example, USB or I2C), or an input apparatus (for example, a keyboard, mouse, or touchpad). During or after an operation of the analog circuit 51, the machine learning accelerator 50 may detect and store the output values of each of the computing layers and/or the specific one or more computing layers to be transmitted to the error calibration apparatus 100 through the input interface.

On the other hand, the corrected value is obtained by simulation or has been stored in advance, and the corrected value is an output value of the input sample that may be obtained by the computing layer under the assumption that the analog circuit 51 has no abnormalities (for example, the error, offset or distortion).

In addition, an error between the output value from the analog circuit 51 or the output value simulated based on the electrical characteristic and the corrected value can be obtained by a difference value, a mean square error (MSE), a root-mean-square error (RMSE), a least-mean-square error (LMSE), cosine similarity, a cosine distance, or other error related functions. Taking the mean square error as an example, the output value simulated based on the electrical characteristic forms a first vector, and the corrected value forms a second vector. The processor 130 may calculate a square value of a difference value of each corresponding element in the two vectors, and calculate a mean value of the square values.

Figure 4:
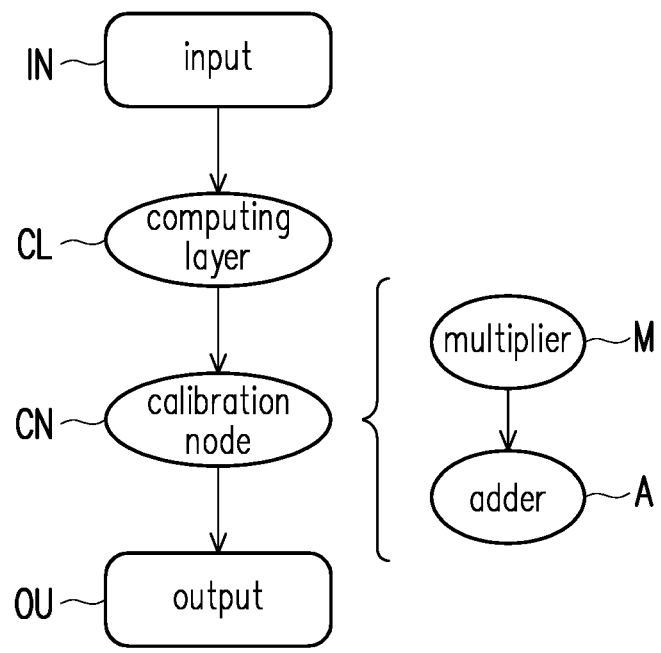
FIG. 4 is a schematic view of a neural network with an added calibration node according to an embodiment of the disclosure.

Referring to FIG. 2, the processor 130 generates a calibration node according to the error between the output value and the corrected value (step S230). Specifically, the calibration node is located at the next layer of the one or more computing layers. For example, FIG. 4 is a schematic view of the neural network NN with the added calibration node according to an embodiment of the disclosure. Referring to FIGS. 3 and 4, a difference from FIG. 3 is that a calibration node CN is added between the computing layer CL and the output OU in FIG. 4.

It is worth noting that the calibration node is used to minimize the error. That is to say, although there is an error between the output value of the computing layer and the corrected value, an error between a calibration value of the output value obtained by inputting the calibration node and the corrected value will become smaller or even zero. Alternatively, the calibration node is used to compensate for the error.

In an embodiment, the processor 13 may determine a computing combination according to the error. The computing combination is formed by one or more operators. The operator may be an arithmetic operator, an assignment operator, a comparison operator, or other types of operators. That is to say, the computing combination may be a function. An output value of the computing combination is a calibration result of the error, and the error is reduced by inputting the output value of the computing layer to the computing combination. That is to say, the calibration result is close to or equal to the corrected value.

In an embodiment, the processor 13 may form an objective function according to the function corresponding to the computing combination. The objective function is an error function that minimizes the function corresponding to the computing combination and the corrected value. For example, the error function is an RMS error, and a mathematical expression thereof is:

$$\arg\min_{(a_i,b_i)} \sum_n \left(a_i \times (O_{analog})_n^i + b_i - O_n^i\right)^2. \quad (1)$$

$O_{analog}^{cal}$ is an output value of the calibration node, and $O_{analog}$ is the output value of the computing layer; $a_i$ and $b_i$ is a constant, and i and n are positive integers, where i represents the $i^{th}$ type of input sample, and n represents the $n^{th}$ input sample. $O_n^i$ is the corrected value corresponding to the $n^{th}$ input sample of the $i^{th}$ type. In addition, the function corresponding to the computing combination is:

$$(O_{analog}^{cal})^i = a_i \times (O_{analog})^i + b_i \quad (2).$$

In an embodiment, the computing combination includes the multiplier and the adder. Taking FIG. 4 as an example, the calibration node CN includes a multiplier M and an adder A. That is, an output value of the computing layer CL is multiplied by a first value by the multiplier M and then added to a second value by the adder A. The processor 13 may determine input values of the multiplier and the adder (i.e., the first value and the second value). Taking Function (2) as an example, $a_i$ is the first value, and $b_i$ is the second value. The two values may be an optimal solution or any solution to the objective function.

In other embodiments, the computing combination may be a combination of other operators, and the processor 130 may obtain an input value of the operator based on the error function formed by the computing combination and the corrected value.

In addition, the calibration node is achieved by a digital circuit. The digital circuit may be a digital circuit formed by one or more of multiplexers, adders, multipliers, encoders, decoders, or various types of logic gates, and may also be a processor, a chip, an integrated circuit, or a microcontroller. Alternatively, a function of the calibration node may be achieved by software. This digital circuit may be embedded in the machine learning accelerator 50, the error calibration apparatus 100, or other external apparatuses or circuits. Since the analog circuit 51 still has an electrical related error, the reduction of the error may be ensured by the calibration of the digital circuit.

In an actual application scenario, the processor 130 may select a large number of input samples of the specific type for the testing, delivery, and/or stage of use of the machine learning accelerator 51, and determine the appropriate calibration nodes of the input samples and parameters thereof accordingly, such as the operator of the computing combination and the input value thereof. That is to say, the calibration node may be dynamically changed according to an application stage.

Based on the above, in the error calibration apparatus and the error calibration method according to the embodiment of the disclosure, the calibration node of the neural network is determined based on the error between the output value of the computing layer achieved by the analog circuit and the corrected value, and the output value of the computing layer is calibrated to be close to or equal to the corrected value by the calibration node achieved by the digital circuit. Accordingly, the abnormality or distortion of the electronic element in the analog circuit may be compensated.

Although the disclosure has been described with reference to the above embodiments, it will be apparent to one of ordinary skill in the art that modifications to the described embodiments may be made without departing from the spirit and the scope of the disclosure. Accordingly, the scope of the disclosure will be defined by the attached claims and their equivalents and not by the above detailed descriptions.

What is claimed is:

1. An error calibration method adapted for calibrating a machine learning accelerator, wherein the machine learning accelerator achieves a computation by using an analog circuit, and the error calibration method comprises:
   determining an error between an output value of at least one computing layer of a neural network and a corresponding corrected value, wherein a computation of the at least one computing layer is achieved by the analog circuit; and
   generating a calibration node according to the error, wherein the calibration node is located at a next layer of the at least one computing layer, the calibration node is used to minimize the error, and the calibration node is achieved by a digital circuit.

2. The error calibration method according to claim 1, wherein generating the calibration node according to the error comprises:
   determining a computing combination according to the error, wherein the computing combination is formed by at least one operator, an output of the computing combination is a calibration result of the error, and the error is reduced by inputting the output value to the computing combination.

3. The error calibration method according to claim 2, wherein the computing combination comprises a multiplier and an adder, and determining the computing combination according to the error comprises:
   determining input values of the multiplier and the adder, wherein the multiplier computes the input value thereof and the output value, and the adder computes the input value thereof and an output of the multiplier.

4. The error calibration method according to claim 1, wherein determining the output value of the at least one computing layer of the neural network comprises:
   obtaining an electrical characteristic of the analog circuit; and
   simulating the output value of the at least one computing layer according to the electrical characteristic.

5. The error calibration method according to claim 1, wherein determining the output value of the at least one computing layer of the neural network comprises:
    receiving the output value from the machine learning accelerator through an input interface.

6. An error calibration apparatus, comprising:
    a memory, configured to store a program code; and
    a processor, coupled to the memory, and configured to load and execute the program code to execute:
        determining an error between an output value of at least one computing layer of a neural network and a corresponding corrected value, wherein a computation of the at least one computing layer is achieved by an analog circuit, and a machine learning accelerator achieves a computation by using the analog circuit; and
        generating a calibration node according to the error, wherein the calibration node is located at a next layer of the at least one computing layer, the calibration node is used to minimize the error, and the calibration node is achieved by a digital circuit.

7. The error calibration apparatus according claim 6, wherein the processor is further configured for:
    determining a computing combination according to the error, wherein the computing combination is formed by at least one operator, an output of the computing combination is a calibration result of the error, and the error is reduced by inputting the output value to the computing combination.

8. The error calibration apparatus according claim 7, wherein the computing combination comprises a multiplier and an adder, and the processor is further configured for:
    determining input values of the multiplier and the adder, wherein the multiplier computes the input value thereof and the output value, and the adder computes the input value thereof and an output of the multiplier.

9. The error calibration apparatus according claim 6, wherein the processor is further configured for:
    obtaining an electrical characteristic of the analog circuit; and
    simulating the output value of the at least one computing layer according to the electrical characteristic.

10. The error calibration apparatus according claim 6, wherein the processor is further configured for:
    receiving the output value from the machine learning accelerator through an input interface.

* * * * *